US012262536B2

(12) United States Patent
Pekny

(10) Patent No.: US 12,262,536 B2
(45) Date of Patent: Mar. 25, 2025

(54) ARRAYS OF MEMORY CELLS INCLUDING PAIRS OF MEMORY CELLS HAVING RESPECTIVE CHARGE STORAGE NODES BETWEEN RESPECTIVE ACCESS LINES

(71) Applicant: MICRON TECHNOLOGY, INC., Boise, ID (US)

(72) Inventor: Theodore T. Pekny, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 17/872,158

(22) Filed: Jul. 25, 2022

(65) Prior Publication Data

US 2022/0359567 A1 Nov. 10, 2022

Related U.S. Application Data

(60) Continuation of application No. 16/736,297, filed on Jan. 7, 2020, now Pat. No. 11,398,493, which is a
(Continued)

(51) Int. Cl.
| | |
|---|---|
| *H10B 43/27* | (2023.01) |
| *H01L 21/28* | (2006.01) |
| *H01L 29/06* | (2006.01) |
| *H10B 41/27* | (2023.01) |
| *H10B 43/10* | (2023.01) |
| *H10B 43/20* | (2023.01) |

(Continued)

(52) U.S. Cl.
CPC ......... *H10B 43/27* (2023.02); *H01L 29/0649* (2013.01); *H01L 29/40117* (2019.08); *H10B 41/27* (2023.02); *H10B 43/10* (2023.02); *H10B 43/20* (2023.02); *H10B 43/30* (2023.02); *H10B 43/35* (2023.02)

(58) Field of Classification Search
CPC ........... H01L 29/40117; H01L 29/0649; H10B 43/35; H10B 43/20; H10B 43/30; H10B 43/10; H10B 43/27; H10B 41/27
See application file for complete search history.

(56) References Cited

U.S. PATENT DOCUMENTS

| | | | |
|---|---|---|---|
| 7,835,179 B1 * | 11/2010 | Prabhakar | G11C 16/28 365/185.24 |
| 2002/0195668 A1 * | 12/2002 | Endoh | H10B 41/27 257/314 |

(Continued)

*Primary Examiner* — Vongsavanh Sengdara
(74) *Attorney, Agent, or Firm* — Dicke, Billig & Czaja, PLLC

(57) ABSTRACT

Arrays of memory cells including an isolation region between first and second access lines, a first memory cell having a control gate in contact with the first access line and a charge storage node having a curved cross-section having a first end in contact with a first portion of the isolation region on a first side of the isolation region and a second end in contact with a second portion of the isolation region on the isolation region's first side, and a second memory cell having a control gate in contact with the second access line and a charge storage node having a curved cross-section having a first end in contact with the first portion of the isolation region on a second side of the isolation region and a second end in contact with the second portion of the isolation region on the isolation region's first side.

24 Claims, 5 Drawing Sheets

Related U.S. Application Data continuation of application No. 16/545,504, filed on Aug. 20, 2019, now Pat. No. 10,957,709, which is a continuation of application No. 15/691,794, filed on Aug. 31, 2017, now Pat. No. 10,522,559, which is a continuation of application No. 15/246,847, filed on Aug. 25, 2016, now Pat. No. 9,768,194, which is a continuation of application No. 14/820,027, filed on Aug. 6, 2015, now Pat. No. 9,455,266, which is a continuation of application No. 13/676,407, filed on Nov. 14, 2012, now Pat. No. 9,147,693, which is a continuation of application No. 13/047,215, filed on Mar. 14, 2011, now Pat. No. 8,329,513, which is a division of application No. 12/047,414, filed on Mar. 13, 2008, now Pat. No. 7,906,818.

(51) Int. Cl.
*H10B 43/30* (2023.01)
*H10B 43/35* (2023.01)

(56) References Cited

U.S. PATENT DOCUMENTS

| | | |
|---|---|---|
| 2004/0084710 A1 | 5/2004 | Baker, Jr. et al. |
| 2004/0206996 A1 | 10/2004 | Lee et al. |
| 2005/0063237 A1* | 3/2005 | Masuoka ............... H10B 69/00 257/E29.302 |
| 2005/0133851 A1* | 6/2005 | Forbes ................. H01L 29/7883 257/315 |
| 2006/0054976 A1* | 3/2006 | Verhoeven .......... H01L 29/7926 257/209 |
| 2006/0234393 A1 | 10/2006 | Bhattacharyya |
| 2007/0158736 A1* | 7/2007 | Arai ....................... H10B 43/20 257/E21.679 |
| 2007/0252201 A1 | 11/2007 | Kito |
| 2007/0272973 A1* | 11/2007 | Park ..................... H01L 29/792 257/E21.409 |
| 2008/0067583 A1* | 3/2008 | Kidoh .................... H10B 43/30 257/326 |
| 2008/0149992 A1* | 6/2008 | Gidon ............... H01L 29/42332 438/258 |
| 2008/0173928 A1* | 7/2008 | Arai ....................... H10B 41/27 257/E21.409 |
| 2008/0173932 A1* | 7/2008 | Kidoh ................... H10B 43/27 257/E21.679 |
| 2008/0173933 A1 | 7/2008 | Fukuzumi |
| 2008/0179659 A1* | 7/2008 | Enda ..................... H10B 43/30 257/326 |
| 2009/0097321 A1* | 4/2009 | Kim .................. H01L 29/42336 438/257 |
| 2009/0129171 A1* | 5/2009 | Masuoka ............... H10B 43/27 365/185.29 |
| 2009/0180324 A1 | 7/2009 | Masuoka |

* cited by examiner

ARRAYS OF MEMORY CELLS INCLUDING PAIRS OF MEMORY CELLS HAVING RESPECTIVE CHARGE STORAGE NODES BETWEEN RESPECTIVE ACCESS LINES

RELATED APPLICATIONS

This application is a continuation of U.S. application Ser. No. 16/736,297, filed Jan. 7, 2020, which is continuation of U.S. application Ser. No. 16/545,504, filed Aug. 20, 2019 and issued as U.S. Pat. No. 10,957,709 on Mar. 23, 2021, which is a continuation of U.S. application Ser. No. 15/691,794, filed Aug. 31, 2017 and issued as U.S. Pat. No. 10,522,559 on Dec. 31, 2019, which is a continuation of U.S. application Ser. No. 15/246,847, filed Aug. 25, 2016 and issued as U.S. Pat. No. 9,768,194 on Sep. 19, 2017, which is a continuation of U.S. application Ser. No. 14/820,027, filed Aug. 6, 2015 and issued as U.S. Pat. No. 9,455,266 on Sep. 27, 2016, which is a continuation of U.S. application Ser. No. 13/676,407, filed Nov. 14, 2012 and issued as U.S. Pat. No. 9,147,693 on Sep. 29, 2015, which is a continuation of U.S. application Ser. No. 13/047,215, filed Mar. 14, 2011 and issued as U.S. Pat. No. 8,329,513 on Dec. 11, 2012, which is a divisional of U.S. application Ser. No. 12/047,414, filed Mar. 13, 2008 and issued as U.S. Pat. No. 7,906,818 on Mar. 15, 2011, all of which applications are commonly assigned and incorporated entirely herein by reference.

FIELD

The present disclosure relates generally to memory arrays and in particular at least one embodiment of the present disclosure relates to memory arrays including pairs of memory cells having respective charge storage nodes between respective access lines.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming of charge storage nodes, such as floating gates or trapping layers or other physical phenomena, determine the data value of each cell. By defining two or more ranges of threshold voltages to correspond to individual data values, one or more bits of information may be stored on each cell. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

One common type of flash memory is a nitride read only memory (NROM), sometimes referred to as semiconductor-oxide-nitride-oxide-semiconductor (SONOS) memory. Such devices generally include silicon nitride ($Si_3N_4$) as a charge-trapping node, although other dielectric materials may be utilized. By accumulating charge in, or discharging, the charge-trapping node within a memory cell, the threshold voltage of that memory cell may be altered.

In order for memory manufacturers to remain competitive, memory designers are constantly trying to increase the density of memory devices. Increasing the density of a flash memory device generally requires reducing spacing between memory cells and/or making memory cells smaller. Smaller dimensions of many device elements may cause operational problems with the cell. For example, the channel between the source/drain regions becomes shorter, possibly causing severe short channel effects.

One way of increasing the density of memory devices is to form multi-layered memory arrays, e.g., often referred to as three-dimensional memory arrays. For example, one type of three-dimensional memory array includes a plurality of horizontal layers of traditional two-dimensional arrays, such as NAND or NOR memory arrays, stacked vertically one atop the other, with the memory cells of each memory array being silicon-on-sapphire transistors, silicon-on-insulator transistors, thin film transistors, thermoelectric polymer transistors, semiconductor-oxide-nitride-oxide-semiconductor transistors, etc. Another type of three-dimensional memory array includes pillars of stacked memory elements, such as vertical NAND strings that pass vertically through multi-stacked layers of electrode material, where each memory element is a semiconductor-oxide-nitride-oxide-semiconductor transistor, for example.

For the reasons stated above, and for other reasons stated below which will become apparent to those skilled in the art upon reading and understanding the present specification, there is a need in the art for alternative three-dimensional memory arrays.

DETAILED DESCRIPTION

Figure 1:
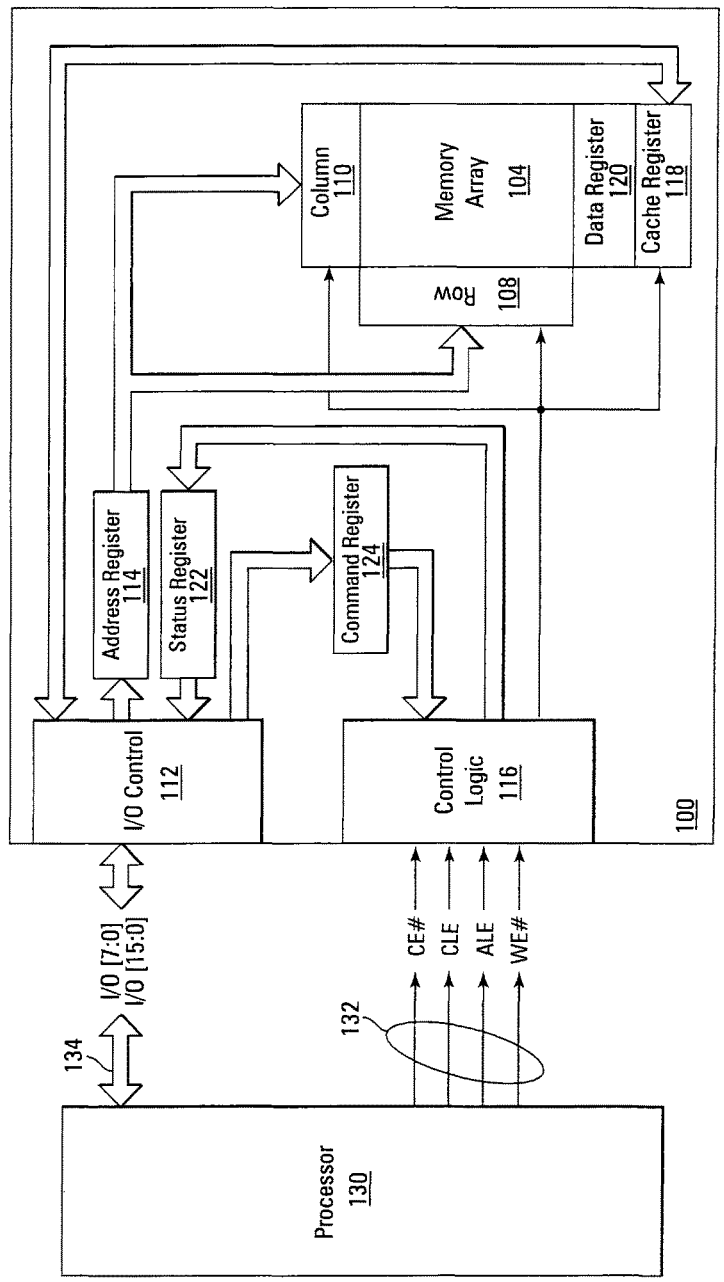
FIG. 1 is a simplified block diagram of an embodiment of a NAND flash memory device, according to an embodiment of the disclosure.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. Use the following if applicable: The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present disclosure is defined only by the appended claims and equivalents thereof.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104 formed in accordance with embodiments of the disclosure. A row decoder 108 and a column decoder 110 are provided to decode address signals. Address signals are received and decoded to access memory array 104.

Memory device 100 also includes input/output (I/O) control circuitry 112 to manage input of commands, addresses and data to the memory device 100 as well as output of data and status information from the memory device 100. An address register 114 is in communication with I/O control circuitry 112, and row decoder 108 and column decoder 110 to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. For one embodiment, control logic 116 may include one or more circuits adapted to produce a particular and predictable outcome or set of outcomes in response to one or more input events. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O)-pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
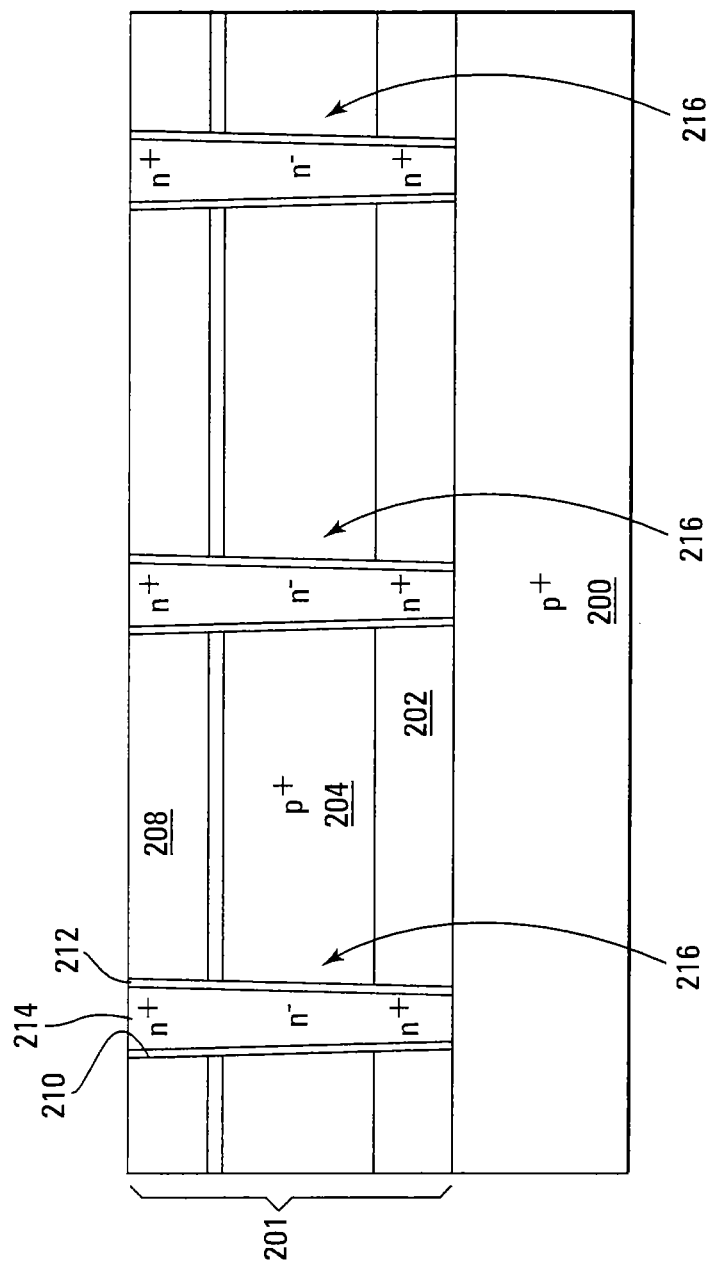
FIGS. 2A-2C are cross-sectional views of a portion of a memory array at various stages of fabrication in accordance with another embodiment of the disclosure.
Figure 2B:
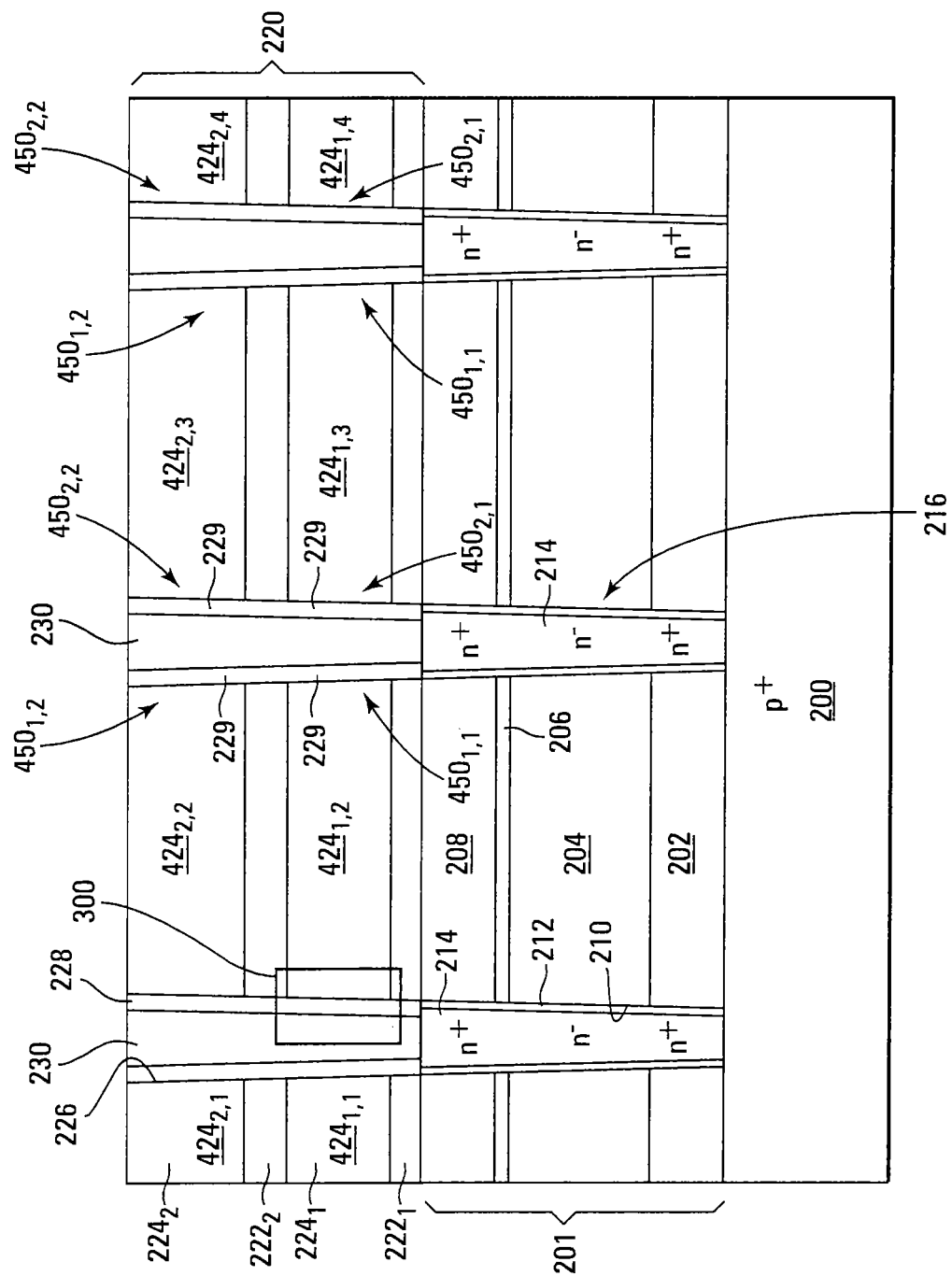
Figure 2C:
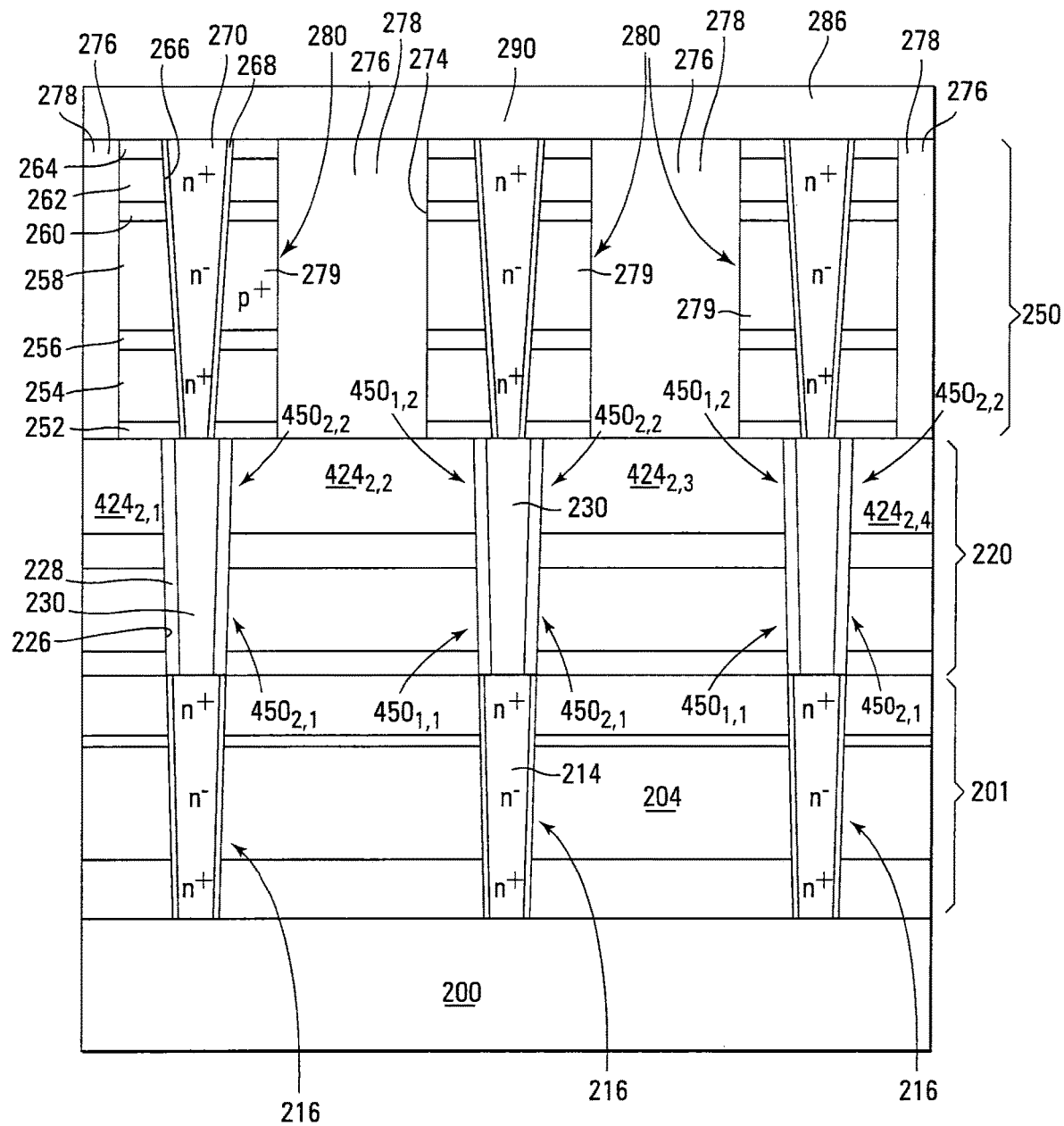

FIGS. 2A-2C are cross sectional views of a portion of a memory array, such as memory array 104 of FIG. 1, during various stages of fabrication, according to an embodiment. FIG. 2A shows a cross-section of a source-select-gate portion 201 of the memory array after several processing steps have been performed. In general, the formation of the structure of FIG. 2A may include forming a dielectric layer 202 overlying a semiconductor substrate 200, such as a silicon-containing substrate, e.g., a P-type monocrystalline silicon substrate, as shown in FIG. 2A. For one embodiment, semiconductor substrate 200 forms a source line 200 of the memory array. Dielectric layer 202 may be an oxide-nitride-oxide (ONO) layer, with a first oxide layer in contact with source line 200, the nitride layer overlying and in contact with the first oxide layer, and a second oxide layer overlying and in contact with the nitride layer.

A conductive layer 204 is formed overlying dielectric layer 202. Conductive layer 204 may be of polysilicon, such as conductively doped P-type polysilicon, as shown in FIG. 2A. Alternatively, conductive layer 204 may be a metal-containing layer, such as a refractory metal silicide layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

A dielectric layer 206, such as a pad oxide layer, e.g., a thermal oxide layer or a deposited silicon dioxide ($SiO_2$) layer, is formed overlying conductive layer 204. A cap 208, such as a nitride cap, e.g., of silicon nitride, is formed overlying dielectric layer 206.

After forming cap 208, holes 210 are formed passing through cap 208, dielectric layer 206, conductive layer 204, and dielectric layer 202, stopping substantially on source line 200. Holes 210 may be formed by patterning cap layer 208 and removing portions of cap layer 208, dielectric layer 206, conductive layer 204, and dielectric layer 202 corresponding to the holes 210 exposed by the patterned cap layer 208 by etching, for example. Note that each of holes 210 exposes an edge of cap layer 208, dielectric layer 206, conductive layer cap layer 204, and dielectric layer 202 and portion of source line 200. Each of holes 210 is then lined with a dielectric layer 212, such as an oxide layer, e.g., using low pressure chemical vapor deposition (LPCVD). For example, dielectric layer 212 is formed on the exposed edges of cap 208, dielectric layer 206, conductive layer 204, and dielectric layer 202. The remaining portion of each of holes 210 is then filled with a conductive layer, e.g., a conductive pillar, such as a plug, 214, e.g., of polysilicon, that overlies dielectric layer 212.

For one embodiment, conductive pillar 214 is conductively doped to an n⁻ conductivity type. Then, for example, ion implantation at a first power setting may be used to convert a portion of conductive pillar 214 at the level of dielectric layer 202 to an n⁺ conductivity type, as shown in FIG. 2A. Ion implantation at a second power setting may be used to convert a portion of conductive pillar 214 at the level of cap layer 208 to an n⁺ conductivity type, for example, as shown in FIG. 2A.

A source select transistor 216, such as a field effect transistor (FET), is formed at each intersection of a conductive pillar 214 and conductive layer 204, where conductive layer 204, dielectric layer 212, and conductive pillar 214 respectively form the control gate (which can also be referred to as a select gate), gate dielectric, and channel, of each select transistor 216. In other words, each source select transistor 216 has a gate dielectric 212 on a conductive pillar 214 and a select gate 204 on the gate dielectric 212. Each select gate 204 forms a portion of a source select line extending substantially perpendicularly into the plane of FIG. 2A (not shown).

In FIG. 2B, a memory cell portion 220 of the memory array is formed overlying the source-select-gate portion 201 of FIG. 2A. Memory cell portion 220 may be formed by forming a dielectric layer 222, e.g., dielectric layer $222_1$, such as a pad oxide layer, e.g., a thermal oxide layer or a deposited silicon dioxide (SiO$_2$) layer, overlying cap layer 208. A conductive layer 224, e.g., conductive layer $224_1$, is formed overlying dielectric layer $222_1$. Conductive layer 224 may be of polysilicon, such as conductively doped P-type polysilicon. Alternatively, conductive layer 224 may be a metal-containing layer, such as a refractory metal silicide layer. Another dielectric layer 222, e.g., dielectric layer $222_2$, is formed overlying conductive layer $224_1$, and another conductive layer 224, e.g., conductive layer $224_2$, is formed overlying dielectric layer $222_2$, as shown in FIG. 2B. For one embodiment, dielectric layers 222 and conductive layers 224 may alternate, as shown in FIG. 2B, until memory cell portion 220 includes up to a certain number, e.g., N, where N is generally some power of two, such as 8, 16, 32, 64, etc., of alternating dielectric layers 222 and conductive layers 224 overlying source-select-gate portion 201.

Holes 226 are formed passing through dielectric layers 222 and conductive layers 224, stopping substantially on an upper surface of source-select-gate portion 201 so that holes 226 are substantially aligned with conductive pillars 214, as shown in FIG. 2B. For example, holes 226 may stop at an upper surface of conductive pillars 214. Holes 226 may be formed by patterning the uppermost conductive layer 224, e.g., conductive layer $224_2$ in FIG. 2B, and removing portions of dielectric layers 222 and conductive layers 224 corresponding to the holes 226 exposed by the patterned conductive layer 224 by etching, for example. Note that each of holes 226 exposes an edge of each dielectric layer 222 and each conductive layer 224 and an upper surface of a conductive pillar 214.

Each of holes 226 may be lined with a charge trapping layer 228, e.g., using low pressure chemical vapor deposition (LPCVD). For example, charge trapping layer 228 is formed on the exposed edges of each conductive layer 224 and each dielectric layer 222. The remaining portion of each of holes 226 is then filled with a conductive layer, e.g., a conductive pillar, such as a plug, 230, e.g., of polysilicon, that overlies charge trapping layer 228 so that each conductive pillar 230 contacts a respective one of conductive pillars 214, as shown in FIG. 2B.

Figure 3:
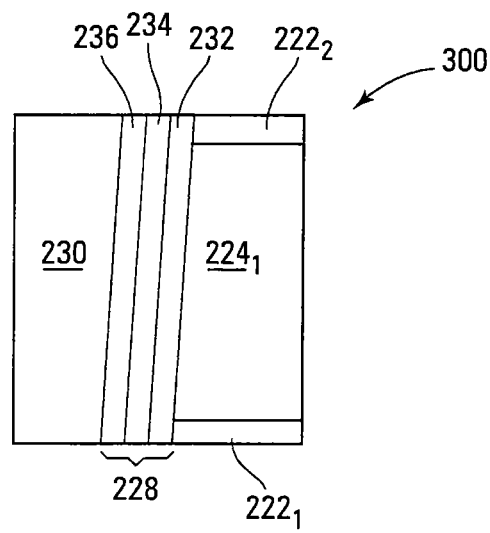
FIG. 3 is an enlarged view of region 300 of FIG. 2B, according to another embodiment of the disclosure.

FIG. 3 is an enlarged view of region 300 of FIG. 2B, illustrating the structure of charge trapping layer 228, according to another embodiment. For one embodiment, conductive pillar 230, charge trapping layer 228, and conductive layer 224 form a semiconductor-oxide-nitride-oxide-semiconductor (SONOS) structure. For example, charge trapping layer 228 may include an oxide layer 232 formed on conductive layer 224, a nitride layer 234 formed on oxide layer 232, and an oxide layer 236 formed on nitride layer 234, as shown in FIG. 3. Therefore, lining each hole 226 includes forming oxide layer 232 on the sidewalls of each hole 226, e.g., using LPCVD, forming nitride layer 234 on oxide layer 232, e.g., using LPCVD, and forming oxide layer 236 on nitride layer 234, e.g., using LPCVD. Conductive pillar 230 is then formed on oxide layer 236 so as to fill the remainder of each hole 226.

Figure 4:
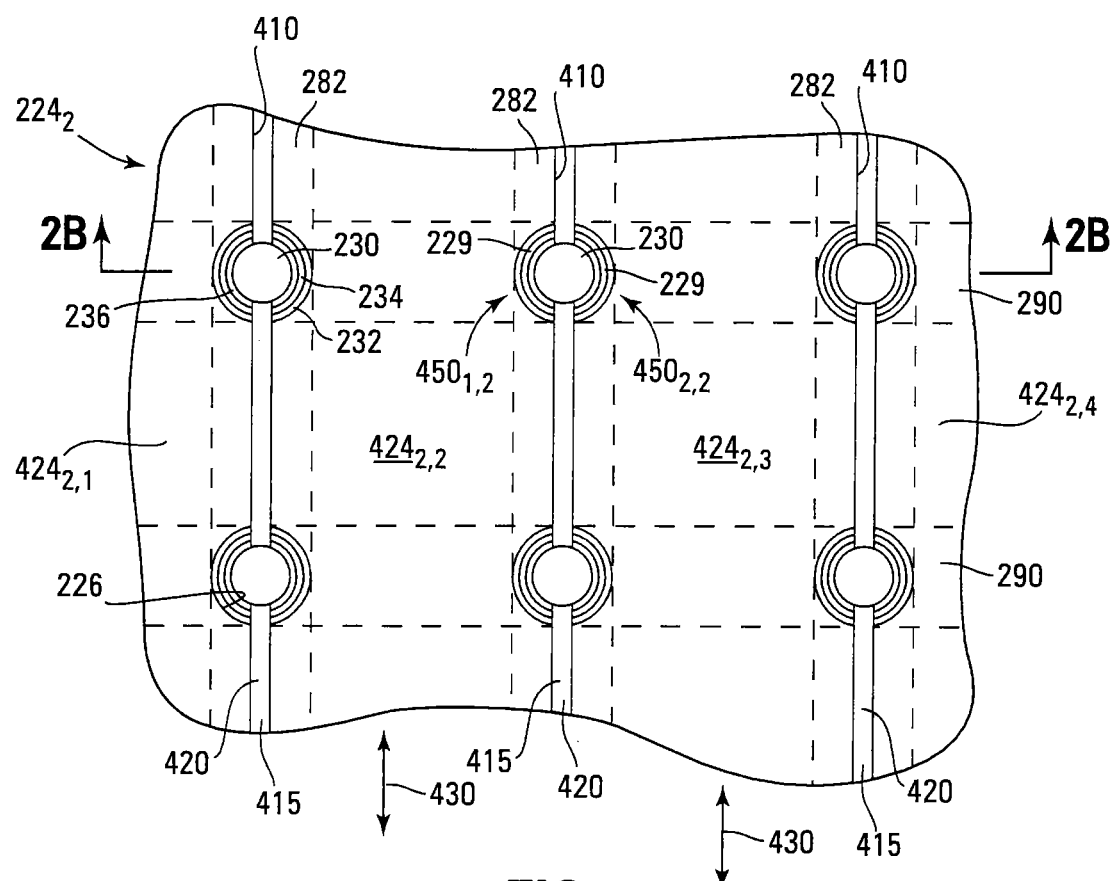
FIG. 4 is a top view of the structure of FIG. 2B, according to another embodiment of the disclosure.

FIG. 4 is a top view of the structure of FIG. 2B. In other words, FIG. 2B is a cross-section viewed along line 2B-2B of FIG. 4. For one embodiment, slots 410 are formed passing through dielectric layers 222 and conductive layers 224 in a direction substantially parallel to holes 226, stopping substantially on the upper surface of source-select-gate portion 201 so that slots 410 extend to substantially the same level below the upper surface of memory cell portion 220 as do holes 226. For example, slots 410 stop at an upper surface of conductive pillars 214 and an upper surface of cap layer 208. Each slot 410 is then filled with a dielectric material 415, such as a high-density-plasma (HDP) oxide, spin-on dielectric material, e.g., hydrogen silsesquioxane (HSQ), hexamethyldisiloxane, octamethyltrisiloxane, etc., to form an isolation region 420

Isolation regions 420 cut each conductive layer 224 into electrically isolated activation lines, such as word lines, 424, as shown in FIGS. 2B and 4, that extend substantially perpendicularly into the plane of FIG. 2B. For example, isolation regions 420 divide conductive layer $224_2$ into a plurality of isolated word lines $424_{2,1}$, $424_{2,2}$, $424_{2,3}$, and $424_{2,4}$. Each isolation region 420 extends between conductive pillars 230 in a direction transverse to the depth of that isolation region 420, e.g., in a direction substantially parallel to the word-line direction indicated by arrows 430.

Each isolation region 420 cuts through at least a portion of the charge trapping layers 228 overlying the conductive pillars 230 between which that isolation region 420 extends so that the each charge trapping layer 228 is not contiguous in a direction around a perimeter of the respective one of the filled holes 226, as shown in FIG. 4. Each isolation region 420 forms a pair of charge traps 229 from each of the charge trapping layers 228, with a charge trap 229 interposed between a side of a conductive pillar 230 and a word line 424, as shown in FIGS. 2B and 4. For example, an isolation region 420 may cut through oxide layer 232, nitride layer 234, and oxide layer 236, as shown in FIG. 4. Alternatively, an isolation region 420 may cut through oxide layer 232 and nitride layer 234 of a charge trap 228. Although holes 226 are shown to have circular cross-sections in FIG. 4, holes 226 may have oval or substantially square or rectangular cross-sections or the like.

Cutting a charge trapping layer 228 with an isolation region 420 forms a pair of isolated memory cells $450_{1,2}$, $450_{2,2}$, with memory cell $450_{1,2}$ occurring at an intersection between a first side of a pillar 230 and word line $424_{2,2}$, and memory cell $450_{2,2}$ occurring at an intersection between a second side, opposite the first side, of that pillar 230 and word line $424_{2,3}$, as shown in FIGS. 2B and 4. At each intersection between a side of a conductive pillar and a word line 424, the word line forms a control gate of the memory cell 450 at that intersection. As shown in FIG. 2B, memory cells $450_{1,1}$ and $450_{1,2}$ are respectively formed at the intersection of a first side of a pillar 230 and word lines $424_{1,2}$ and $424_{2,2}$ form a first serially-coupled string, e.g., a first NAND string, of memory cells on the first side of that pillar 230, and memory cells $450_{2,1}$ and $450_{2,2}$ are respectively formed at the intersection of the second side of that pillar 230 and word lines $424_{1,3}$ and $424_{2,3}$ form a second serially-coupled string, e.g., a second NAND string, of memory cells on the second side of that pillar 230. Alternatively, memory cells of a serially-coupled string may alternate on opposing sides of a pillar 230. For example, memory cells $450_{1,1}$ and $450_{2,2}$ respectively formed at the intersection of a first side of a pillar 230 and word line $424_{1,2}$ and at the intersection of a second side of that pillar 230 and word line $424_{2,3}$ may form a first serially-coupled string, e.g., a first NAND string, of memory cells on alternating sides of that pillar 230, and memory cells $450_{2,1}$ and $450_{1,2}$ respectively formed at the intersection of the second side of that pillar 230 and word lines $424_{1,3}$ and at the intersection of the first side of that pillar 230 and word line $424_{2,3}$ may form a second serially-coupled string, e.g., a second NAND string, of memory cells on alternating sides of that pillar 230. For one embodiment, each memory cell 450 may be a non-volatile SONOS flash memory cell that includes a portion of a word line 424 that forms a control gate of the memory cell 450, a charge trap 228, including an oxide layer 232 formed on the word line 424, a nitride layer 234 formed on the oxide layer 232, an oxide layer 236 formed on the nitride layer 234, and a portion of a conductive pillar 230 formed on the oxide layer 236.

In FIG. 2C, a drain-select-gate portion 250 of the memory array is formed overlying the memory cell portion 220 of FIG. 2B, according to an embodiment. Drain-select-gate portion 250 may be formed by forming a dielectric layer 252, such as a pad oxide layer, e.g., a thermal oxide layer or a deposited silicon dioxide ($SiO_2$) layer, overlying the uppermost word lines 424, e.g., word lines $424_{2,1}$, $424_{2,2}$, $424_{2,3}$, and $424_{2,4}$, the isolation region 420 between the uppermost word lines 424, and conductive pillars 230, as shown in FIG. 2C.

A dielectric layer 254, such as a nitride layer, e.g., a layer of silicon nitride, is formed overlying dielectric layer 252. A dielectric layer 256, e.g., similar to dielectric layer 252, is formed overlying dielectric layer 254. A conductive layer 258, e.g., similar to conductive layer 204 as described above in conjunction with FIG. 2A, is formed overlying dielectric layer 256. A dielectric layer 260, e.g., similar to dielectric layer 252, is formed overlying conductive layer 258. A dielectric layer 262, e.g., similar to dielectric layer 254, is formed overlying dielectric layer 260. A dielectric layer 264, e.g., similar to dielectric layer 252, is formed overlying dielectric layer 262.

After forming dielectric layer 264, holes 266 are formed passing through dielectric layer 264, dielectric layer 262, dielectric layer 260, conductive layer 258, dielectric layer 254, and dielectric layer 252, e.g., stopping substantially on conductive pillars 230. For example holes 266 may be aligned with conductive pillars 230, as shown in FIG. 2C. Holes 266 may be formed by patterning dielectric layer 264 and removing portions of dielectric layer 264, dielectric layer 262, dielectric layer 260, conductive layer 258, dielectric layer 256, dielectric layer 254, and dielectric layer 252 corresponding to the holes 266 exposed by the patterned dielectric layer 264 by etching, for example. Note that each of holes 266 exposes an edge of dielectric layer 264, dielectric layer 262, dielectric layer 260, conductive layer 258, dielectric layer 254, and dielectric layer 252 and an upper surface of a conductive pillar 230. Each of holes 266 is then lined with a dielectric layer 268, such as an oxide layer, e.g., using low pressure chemical vapor deposition (LPCVD). For example, dielectric layer 268 is formed on the exposed edges of dielectric layer 264, dielectric layer 262, dielectric layer 260, conductive layer 258, dielectric layer 254, and dielectric layer 252. The remaining portion of each of holes 266 is then filled with a conductive layer, e.g., a conductive pillar, such as a plug, 270, e.g., of polysilicon, that overlies dielectric layer 268.

For one embodiment, conductive pillar 270 is conductively doped to an $n^-$ conductivity type. Then, for example, ion implantation at a first power setting may be used to convert a portion of conductive pillar 270 at the level of dielectric layers 252, 254, and 256 to an $n^+$ conductivity type, as shown in FIG. 2C. Ion implantation at a second power setting may be used to convert a portion of conductive pillar 270 at the level of dielectric layers 260, 262, and 264 to an $n^+$ conductivity type, for example, as shown in FIG. 2C.

For one embodiment, trenches 274 are formed passing through dielectric layer 264, dielectric layer 262, dielectric layer 260, conductive layer 258, dielectric layer 256, dielectric layer 254, and dielectric layer 252, stopping substantially on the uppermost word lines 424, e.g., word lines $424_{2,1}$, $424_{2,2}$, $424_{2,3}$, and $424_{2,4}$ of FIG. 2C. Trenches 274 may be formed by patterning dielectric layer 264 and removing portions of dielectric layer 264, dielectric layer 262, dielectric layer 260, conductive layer 258, dielectric layer 256, dielectric layer 254, and dielectric layer 252 corresponding to the trenches 274 exposed by the patterned dielectric layer 264 by etching, for example. Each trench 274 is then filled with a dielectric material 276, such as a high-density-plasma (HDP) oxide, spin-on dielectric material, e.g., hydrogen silsesquioxane (HSQ), hexamethyldisiloxane, octamethyltrisiloxane, etc., to form isolation regions 278. Isolation regions 278 define a control gate, such as a select gate 279, at each intersection of the remaining portions of conductive layer 258 and a conductive pillar 270, as shown in FIG. 2C.

A drain select transistor 280, such as a field effect transistor (FET), is formed at each intersection of a conductive pillar 270 and conductive layer 258, where conductive layer 258, dielectric layer 268, and conductive pillar 270 respectively form the select gate, gate dielectric, and channel, of each drain select transistor 280. In other words, each drain select transistor 280 has a gate dielectric 268 on a conductive pillar 270 and a select gate 279 on the gate dielectric 268.

Each select gate 279 forms a portion of a drain select line 282, indicated by a dashed line in FIG. 4. Each drain select line 282 overlies and is substantially parallel to a dielectric-filled slot 410, as shown in FIG. 4.

A conductive layer 286, e.g., a metal layer, such as aluminum, is formed overlying an upper surface of each isolation region 278, an upper surface of dielectric layer 264, and an upper surface of each conductive pillar 270, as shown in FIG. 2C. Conductive layer 286 is patterned, etched, and processed, e.g., using standard processing, to produce individual data lines, such as bit lines 290, shown as dashed lines in FIG. 4, therefrom. Bit lines 290 are substantially orthogonal to select lines 282 and dielectric-filled slots 410, as shown in FIG. 4.

Note that the memory cells 450 on each side of a conductive pillar 230 and dielectric-filled slot 410 (FIG. 4) form a serially-coupled string of memory cells 450 interposed between a source select transistor 216 and a drain select transistor 280. For example, FIG. 2C shows a serially-coupled string of memory cells $450_{1,1}$ and $450_{1,2}$ located on one side of a conductive pillar 230 and interposed between source select transistor 216 and a drain select transistor 280, and a serially-coupled string of memory cells $450_{2,1}$ and $450_{2,2}$, located on the opposite side of that conductive pillar 230 and interposed between source select transistor 216 and a drain select transistor 280. The common pillar 230 couples the memory cells $450_{1,1}$ and $450_{1,2}$ in series and the memory cells $450_{2,1}$ and $450_{2,2}$ in series. For some embodiments, the number of memory cells in a serially-coupled string of memory cells may be some power of 2, such as 8, 16, 32, 64, etc.

A source select transistor 216 is coupled to each serially-coupled string of memory cells through a conductive pillar 214, and a drain select transistor 280 is coupled to each serially-coupled string of memory cells through a conductive pillar 270, as shown in FIG. 2C. Each source select transistor 216 selectively couples the lower end of each conductive pillar 230 and thus the serially-coupled string of memory cells on either side of that conductive pillar 230 to source line 200, as shown in FIG. 2C. Each drain select transistor 280 selectively couples the upper end of each conductive pillar 230 and thus the serially-coupled string of memory cells on either side of that conductive pillar 230 to a bit line 290.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. An array of memory cells, comprising:
   a first memory cell having a control gate connected to a first access line, having a channel, and having a charge storage node between its control gate and its channel, wherein the first access line forms the control gate of the first memory cell;
   a second memory cell having a control gate connected to a second access line, having a channel, and having a charge storage node between its control gate and its channel, wherein the second access line forms the control gate of the second memory cell; and
   an isolation region between the first access line and the second access line;
   wherein the charge storage node of the first memory cell is between the first access line and a first side of the isolation region;
   wherein the charge storage node of the second memory cell is between the second access line and a second side of the isolation region opposite the first side of the isolation region;
   wherein the charge storage node of the first memory cell has a curved cross-section having a first end in contact with a first portion of the isolation region on the first side of the isolation region, and has a second end in contact with a second portion of the isolation region on the first side of the isolation region; and
   wherein the charge storage node of the second memory cell has a curved cross-section having a first end in contact with the first portion of the isolation region on the second side of the isolation region, and has a second end in contact with the second portion of the isolation region on the second side of the isolation region.

2. The array of memory cells of claim 1, wherein no portion of the charge storage node of the first memory cell is in contact with any portion of the charge storage node of the second memory cell.

3. The array of memory cells of claim 1, wherein the charge storage node of the first memory cell is an oxide-nitride-oxide structure.

4. The array of memory cells of claim 1, further comprising a semiconductor structure forming the channel for the first memory cell.

5. The array of memory cells of claim 4, wherein an area of the charge storage node of the first memory cell in contact with the first access line is greater than an area of the charge storage node of the first memory cell in contact with the semiconductor structure.

6. The array of memory cells of claim 4, wherein the semiconductor structure further forms the channel for the second memory cell.

7. The array of memory cells of claim 6, wherein an area of the charge storage node of the first memory cell in contact with the first access line is greater than an area of the charge storage node of the first memory cell in contact with the semiconductor structure, and wherein an area of the charge storage node of the second memory cell in contact with the second access line is greater than an area of the charge storage node of the second memory cell in contact with the semiconductor structure.

8. The array of memory cells of claim 1, wherein a portion of the charge storage node of the first memory cell is parallel with a portion of the charge storage node of the second memory cell.

9. The array of memory cells of claim 1, wherein the curved cross-section of the charge storage node of the first memory cell is a portion of a circular cross-section.

10. The array of memory cells of claim 1, wherein the curved cross-section of the charge storage node of the first memory cell is a portion of an oval cross-section.

11. An array of memory cells, comprising:
    a plurality of memory cells comprising a first memory cell, a second memory cell, a third memory cell and a fourth memory cell, wherein each memory cell of the plurality of memory cells comprises a control gate, a charge storage node and a channel;
    a first access line;

a second access line; and an isolation region between the first access line and the second access line;

wherein the control gate of the first memory cell and the control gate of the second memory cell are commonly connected to the first access line, wherein the first access line forms the control gate of the first memory cell and forms the control gate of the second memory cell;

wherein the control gate of the third memory cell and the control gate of the fourth memory cell are commonly connected to the second access line, wherein the second access line forms the control gate of the third memory cell and forms the control gate of the fourth memory cell;

wherein the charge storage node of the first memory cell and the charge storage node of the second memory cell are each between the first access line and the second access line;

wherein the charge storage node of the third memory cell is between the second access line and the charge storage node of the first memory cell;

wherein the charge storage node of the fourth memory cell is between the second access line and the charge storage node of the second memory cell;

wherein the charge storage node of the first memory cell has a curved cross-section having a first end in contact with a first portion of the isolation region on a first side of the isolation region, and has a second end in contact with a second portion of the isolation region on the first side of the isolation region;

wherein the charge storage node of the second memory cell has a curved cross-section having a first end in contact with a third portion of the isolation region on the first side of the isolation region, and has a second end in contact with a fourth portion of the isolation region on the first side of the isolation region;

wherein the charge storage node of the third memory cell has a curved cross-section having a first end in contact with the first portion of the isolation region on a second side of the isolation region opposite the first side of the isolation region, and has a second end in contact with the second portion of the isolation region on the second side of the isolation region; and wherein the charge storage node of the fourth memory cell has a curved cross-section having a first end in contact with the third portion of the isolation region on the second side of the isolation region, and has a second end in contact with the fourth portion of the isolation region on the second side of the isolation region.

12. The array of memory cells of claim 11, wherein the charge storage node of the first memory cell is separated from the charge storage node of the second memory cell, and wherein the charge storage node of the third memory cell is separated from the charge storage node of the fourth memory cell.

13. The array of memory cells of claim 11, further comprising:

a third access line; and a fourth access line;

wherein the control gate of a fifth memory cell of the plurality of memory cells and the control gate of a sixth memory cell of the plurality of memory cells are commonly connected to the third access line, wherein the third access line forms the control gate of the fifth memory cell and forms the control gate of the sixth memory cell;

wherein the control gate of a seventh memory cell of the plurality of memory cells and the control gate of an eighth memory cell of the plurality of memory cells are commonly connected to the fourth access line, wherein the fourth access line forms the control gate of the seventh memory cell and forms the control gate of the eighth memory cell;

wherein the charge storage node of the fifth memory cell and the charge storage node of the sixth memory cell are each between the third access line and the fourth access line;

wherein the charge storage node of the seventh memory cell is between the fourth access line and the charge storage node of the fifth memory cell;

wherein the charge storage node of the eighth memory cell is between the fourth access line and the charge storage node of the sixth memory cell;

wherein the charge storage node of the fifth memory cell has a curved cross-section having a first end in contact with a fifth portion of the isolation region on the first side of the isolation region, and has a second end in contact with a sixth portion of the isolation region on the first side of the isolation region;

wherein the charge storage node of the sixth memory cell has a curved cross-section having a first end in contact with a seventh portion of the isolation region on the first side of the isolation region, and has a second end in contact with an eighth portion of the isolation region on the first side of the isolation region;

wherein the charge storage node of the seventh memory cell has a curved cross-section having a first end in contact with the fifth portion of the isolation region on the second side of the isolation region, and has a second end in contact with the sixth portion of the isolation region on the second side of the isolation region; and wherein the charge storage node of the eighth memory cell has a curved cross-section having a first end in contact with the seventh portion of the isolation region on the second side of the isolation region, and has a second end in contact with the eighth portion of the isolation region on the second side of the isolation region.

14. The array of memory cells of claim 11, further comprising:

a third access line;

a fifth memory cell and a sixth memory cell having respective control gates connected to the second access line, and having respective charge storage nodes, wherein the second access line forms the control gate of the fifth memory cell and forms the control gate of the sixth memory cell;

a seventh memory cell and an eighth memory cell having respective control gates connected to the third access line, and having respective charge storage nodes, wherein the third access line forms the control gate of the seventh memory cell and forms the control gate of the eighth memory cell; and a second isolation region between the second access line and the third access line;

wherein the second access line is between the charge storage node of the fifth memory cell and the charge storage node of the third memory cell;

wherein the second access line is between the charge storage node of the sixth memory cell and the charge storage node of the fourth memory cell;

wherein the first memory cell is selectively connected to a first data line;

wherein the second memory cell is selectively connected to a second data line;
wherein the third memory cell is selectively connected to the first data line;
wherein the fourth memory cell is selectively connected to the second data line;
wherein the fifth memory cell is selectively connected to the first data line;
wherein the sixth memory cell is selectively connected to the second data line;
wherein the seventh memory cell is selectively connected to the first data line; and
wherein the eighth memory cell is selectively connected to the second data line.

15. The array of memory cells of claim 11, wherein the first memory cell, the second memory cell, the third memory cell, and the fourth memory cell are all formed at a same level relative to a semiconductor substrate.

16. The array of memory cells of claim 11, wherein the charge storage node of the first memory cell comprises a first dielectric material in contact with the first access line, a second dielectric material in contact with the first dielectric material, and a third dielectric material in contact with the second dielectric material.

17. The array of memory cells of claim 16, wherein the first dielectric material and the third dielectric material each comprise silicon dioxide, and wherein the second dielectric material comprises silicon nitride.

18. An array of memory cells, comprising:
a plurality of memory cells formed overlying a semiconductor substrate, wherein the plurality of memory cells comprises a first memory cell, a second memory cell, a third memory cell, and a fourth memory cell, wherein each memory cell of the plurality of memory cells comprises a control gate, a charge storage node and a channel;
a first access line connected to the control gate of the first memory cell at a first level relative to the semiconductor substrate;
a second access line connected to the control gate of the second memory cell at the first level relative to the semiconductor substrate;
a third access line connected to the control gate of the third memory cell at a second level relative to the semiconductor substrate, different than the first level;
a fourth access line connected to the control gate of the fourth memory cell at the second level relative to the semiconductor substrate;
wherein the first access line is isolated from the second access line by an isolation region, and the third access line is isolated from the fourth access line by the isolation region;
wherein the third access line is isolated from the first access line by a first dielectric layer orthogonal to the isolation region, and the fourth access line is isolated from the second access line by a second dielectric layer orthogonal to the isolation region;
wherein the charge storage node of the first memory cell is contiguous with the charge storage node of the third memory cell;
wherein the charge storage node of the second memory cell is contiguous with the charge storage node of the fourth memory cell;
wherein the charge storage node of the first memory cell has a curved cross-section that is convex toward the first access line and concave toward a first side of the isolation region;
wherein the charge storage node of the second memory cell has a curved cross-section that is convex toward the second access line and concave toward a second side of the isolation region opposite the first side of the isolation region;
wherein the charge storage node of the third memory cell has a curved cross-section that is convex toward the third access line and concave toward the first side of the isolation region; and
wherein the charge storage node of the fourth memory cell has a curved cross-section that is convex toward the fourth access line and concave toward the second side of the isolation region.

19. The array of memory cells of claim 18, wherein the charge storage node of the first memory cell, the charge storage node of the second memory cell, the charge storage node of the third memory cell, and the charge storage node of the fourth memory cell are each in contact with the isolation region.

20. The array of memory cells of claim 19, wherein no portion of the charge storage node of the first memory cell is in contact with the charge storage node of the second memory cell, and wherein no portion of the charge storage node of the third memory cell is in contact with the charge storage node of the fourth memory cell.

21. The array of memory cells of claim 18, wherein a distance between a center of the charge storage node of the first memory cell and a center of the charge storage node of the second memory cell is greater than a distance between a center of the charge storage node of the third memory cell and a center of the charge storage node of the fourth memory cell.

22. The array of memory cells of claim 18, wherein the charge storage node of the first memory cell comprises a first dielectric material in contact with the first access line, a second dielectric material in contact with the first dielectric material, and a third dielectric material in contact with the second dielectric material.

23. The array of memory cells of claim 22, wherein the first dielectric material and the third dielectric material each comprise silicon dioxide, and wherein the second dielectric material comprises silicon nitride.

24. The array of memory cells of claim 22, wherein the third dielectric material is in contact with a channel of the first memory cell.

* * * * *